United States Patent
Mastantuono et al.

(10) Patent No.: US 9,444,413 B2
(45) Date of Patent: Sep. 13, 2016

(54) HIGH BANDWIDTH AMPLIFIER

(71) Applicant: Telefonaktiebolaget L M Ericsson (publ), Stockholm (SE)

(72) Inventors: Daniele Mastantuono, Lund (SE); Sven Mattisson, Bjärred (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 14/432,759

(22) PCT Filed: Feb. 4, 2015

(86) PCT No.: PCT/EP2015/052320
§ 371 (c)(1),
(2) Date: Apr. 1, 2015

(65) Prior Publication Data
US 2016/0226454 A1 Aug. 4, 2016

(51) Int. Cl.
H03F 3/68 (2006.01)
H03F 1/42 (2006.01)
H03F 3/19 (2006.01)
H03F 3/60 (2006.01)

(52) U.S. Cl.
CPC ........... *H03F 1/42* (2013.01); *H03F 3/19* (2013.01); *H03F 3/605* (2013.01); *H03F 3/68* (2013.01); *H03F 2200/36* (2013.01); *H03F 2200/451* (2013.01)

(58) Field of Classification Search
CPC ............ H03F 1/42; H03F 3/19; H03F 3/605; H03F 3/602; H03F 3/211; H03F 3/68
USPC .......................................... 330/295, 310, 311
See application file for complete search history.

(56) References Cited

U.S. PATENT DOCUMENTS 5,045,808 A 9/1991 Taylor
7,696,828 B2 * 4/2010 Chang ................... H03F 1/223
330/311

(Continued)

FOREIGN PATENT DOCUMENTS

CN 101997489 A 3/2011
JP 59126306 A 7/1984

(Continued)

OTHER PUBLICATIONS

Reiha M. et al., "A 1.2 V Reactive-Feeback 3.1-10.6 GHz Low-Noise Amplifier in 0.13 CMOS," IEEE Journal of Solid-State Circuits, vol. 42, No. 5, May 2007, Piscataway, NJ, pp. 1023-1033.

(Continued)

*Primary Examiner* — Khanh V Nguyen
(74) *Attorney, Agent, or Firm* — Coats & Bennett, PLLC

(57) ABSTRACT

An amplifier (100) comprising:
first, second, third and fourth transistors (M1, M2, M3, M4), an input (10) for an input signal, and a first output (22) for a first amplified signal;
a first terminal (T11) of the first transistor (M1) coupled to a first voltage rail (12), a second terminal (T12) of the first transistor (M1) coupled to a first terminal (T31) of the third transistor (M3), and a gate (G1) of the first transistor (M1) coupled to the input (10);
a first terminal (T21) of the second transistor (M2) coupled to a second voltage rail (14), a second terminal (T22) of the second transistor (M2) coupled to the first output (22), and a gate (G2) of the second transistor (M2) coupled to the input (10);
a load (40) coupled between a second terminal (T32) of the third transistor (M3) and a third voltage rail (20), and a gate (G3) of the third transistor (M3) coupled to a bias node (16) for applying a bias voltage to the gate (G3) of the third transistor (M3);
a first terminal (T41) of the fourth transistor (M4) coupled to the first output (22), a second terminal (T42) of the fourth transistor (M4) coupled to a fourth voltage rail (24), and a gate (G4) of the fourth transistor (M4) coupled to the second terminal (T32) of the third transistor (M3); and
a first capacitive element (C1) coupled between the second terminal (T32) of the third transistor (M3) and the first output (22).

17 Claims, 3 Drawing Sheets

(56) References Cited

U.S. PATENT DOCUMENTS

| | | | | |
|---|---|---|---|---|
| 7,843,270 | B2* | 11/2010 | Li | H03F 1/26 330/295 |
| 8,310,312 | B2* | 11/2012 | Lee | H03F 1/223 330/295 |
| 8,436,684 | B2* | 5/2013 | Riekki | H03F 1/0277 330/302 |
| 2006/0033575 | A1 | 2/2006 | Ooya et al. | |
| 2007/0096821 | A1 | 5/2007 | Ryu et al. | |
| 2010/0214020 | A1 | 8/2010 | Cooney | |
| 2013/0162354 | A1 | 6/2013 | Zhu et al. | |
| 2014/0266461 | A1* | 9/2014 | Youssef | H03F 3/68 330/295 |

FOREIGN PATENT DOCUMENTS

| | | |
|---|---|---|
| WO | 2007132274 A2 | 11/2007 |
| WO | 2010028429 A1 | 3/2010 |

OTHER PUBLICATIONS

Bertuccio G. et al., "MOSFET Diode as a Feedback Reset Element on Charge Amplifiers," IEEE Transactions on Nuclear Science, vol. 46, No. 3, Jun. 1999, New York, NY, pp. 757-760.

Nosal Z M et al., "InP HBT transimpedance amplifier for 43 Gb/s optical link applications," 2003 MTT-S International Microwave Symposium Digest, Jun. 8, 2003, Philadelphia, PA, vol. 1, pp. 117-120.

\* cited by examiner

HIGH BANDWIDTH AMPLIFIER

FIELD OF THE DISCLOSURE

The present disclosure relates to an amplifier, a receiver comprising an amplifier, and a wireless communication apparatus comprising a receiver.

BACKGROUND TO THE DISCLOSURE

Next generation wireless networks, such as fifth generation (5G) networks require increased capacity. This increased capacity can be provided by supporting a large communication bandwidth. However, increasing the bandwidth of a wireless receiver is challenging, affecting not only radio frequency circuits but also requiring circuits traditionally operating at lower frequencies to operate at higher frequencies. Therefore, there is a requirement for new baseband circuits capable of supporting a large bandwidth.

In recent decades, baseband low impedance filtering stages have become key blocks for direct down conversion receivers. A typical solution employs a transimpedance amplifier (TIA) based on a differential amplifier with a feedback resistor-capacitor (RC) network, providing low input impedance at a virtual ground, and a first order filter response.

However, a TIA has several disadvantages. Designing a TIA with a large bandwidth, in particular exceeding 500 MHz requires a very high gain-bandwidth (GBW) amplifier. An operational amplifier (OPAMP) used to implement a TIA can achieve very high gain but not at very high frequencies. The stability and frequency response of a TIA is very sensitive to variations in load. It is difficult to provide a TIA having a frequency response profile higher than first order. Due to the load sensitivity of the TIA and its low order filtering characteristic, often a higher order filtering stage is required following the TIA, and this higher order filtering stage has a high design complexity and must be designed in close conjunction with the TIA. With high linearity requirements it is very difficult to design a wideband active filter, especially in sub-micron technologies with their low supply voltages.

Alternatively, a current amplifier may be employed to drive a, possibly passive, filter, or load, as it's stability and frequency response are less dependent on load variations than for a TIA. The current amplifier has the advantage of being less sensitive to the load, relaxing the design of subsequent stages of a receiver. Typically, a current amplifier consists of an amplifying input stage driving an output stage, and possibly with an embedded feedback network. The amplifying stage must provide enough gain and bandwidth to drive the load presented by the output stage across the desired bandwidth. Thus, the current amplifier typically requires an input amplifying stage with the same requirements of high gain and large bandwidth as the OPAMP of a TIA. A large bandwidth may be provided by employing a single transistor for the input amplifying stage, but such a single transistor may not provide sufficient gain. Alternatively, the input amplifying stage may employ a classical cascode arrangement of transistors for providing a high gain, but such an arrangement may not provide sufficient bandwidth, due to its high output impedance generating a pole at low frequency.

There is a requirement for an improved high bandwidth amplifier.

SUMMARY OF THE PREFERRED EMBODIMENTS

According to a first aspect there is provided an amplifier comprising:

first, second, third and fourth transistors, an input for an input signal, and a first output for a first amplified signal;

a first terminal of the first transistor coupled to a first voltage rail, a second terminal of the first transistor coupled to a first terminal of the third transistor, and a gate of the first transistor coupled to the input;

a first terminal of the second transistor coupled to a second voltage rail, a second terminal of the second transistor coupled to the first output, and a gate of the second transistor coupled to the input;

a load coupled between a second terminal of the third transistor and a third voltage rail, and a gate of the third transistor coupled to a bias node for applying a bias voltage to the gate of the third transistor;

a first terminal of the fourth transistor coupled to the first output, a second terminal of the fourth transistor coupled to a fourth voltage rail, and a gate of the fourth transistor coupled to the second terminal of the third transistor; and a first capacitive element coupled between the second terminal of the third transistor and the first output.

The amplifier according to the first aspect enables a high bandwidth of operation in conjunction with low complexity. The amplifier also enables a high gain at high frequencies, relative to gain at low frequencies.

In some embodiments, the load may comprise a first resistive element. This feature enables low complexity. In other embodiments the load may comprises an active bias circuit. This feature enables the load to provide high impedance with a low voltage drop, and therefore enables the third voltage rail to operate at a lower voltage.

The second transistor may be a duplicate of the first transistor. This feature enables simple implementation and can minimise the impact of integrated circuit process variations.

The first terminals of the respective first, second, third and fourth transistors may each be a source, and the second terminals of the respective first, second, third and fourth transistors may each be a drain. Alternatively, the first terminals of the respective first, second, third and fourth transistors may each be a drain, and the second terminals of the respective first, second, third and fourth transistors may each be a source.

The load may have an impedance exceeding the reciprocal of a transconductance of the fourth transistor. This feature enables the output impedance of the amplifier to be inductive, thereby, in conjunction with a capacitive load coupled to the first output, creating a peak in the frequency response of the amplifier and of the combination of the amplifier and capacitive load.

The first capacitive element may have a first capacitance that is variable. This feature enables the frequency response of the amplifier to be modified without modifying the input impedance of the amplifier or the output impedance of the amplifier.

The amplifier may comprise an output stage coupled to the first output.

The output stage may present a load capacitance between the first output and a fifth voltage rail, and the first capacitive element may have a/the first capacitance arranged such that the sum of the first capacitance and an input capacitance of the fourth transistor between the gate of the fourth transistor and the first output is equal, within plus or minus twenty percent, to the load capacitance. This feature enables a wide bandwidth.

The amplifier may further comprise a second output, and the output stage may comprise:

a second resistive element coupled between a first terminal of a fifth transistor and a/the fifth voltage rail;

a second terminal of the fifth transistor coupled to the second output;

a gate of the fifth transistor coupled to the first output;

a second capacitive element coupled between the input and the first terminal of the fifth transistor; and a third resistive element coupled between the input and the first terminal of the fifth transistor. This embodiment provides current amplification, that is, generates an output current proportional to an input current.

The first terminal of the fifth transistor may be a source, and the second terminal of the fifth transistor may be a drain. Alternatively, the first terminal of the fifth transistor may be a drain, and the second terminal of the fifth transistor may be a source.

Any of the first, second, third, fourth and fifth transistors may be one of a bipolar junction transistor, BJT, and a field effect transistor, FET.

According to a second aspect there is provided a receiver comprising the amplifier.

According to a third aspect, there is provided a wireless communication device comprising the receiver.

Preferred embodiments are described, by way of example only, with reference to the accompanying drawings.

DETAILED DESCRIPTION OF PREFERRED EMBODIMENTS

Figure 1:
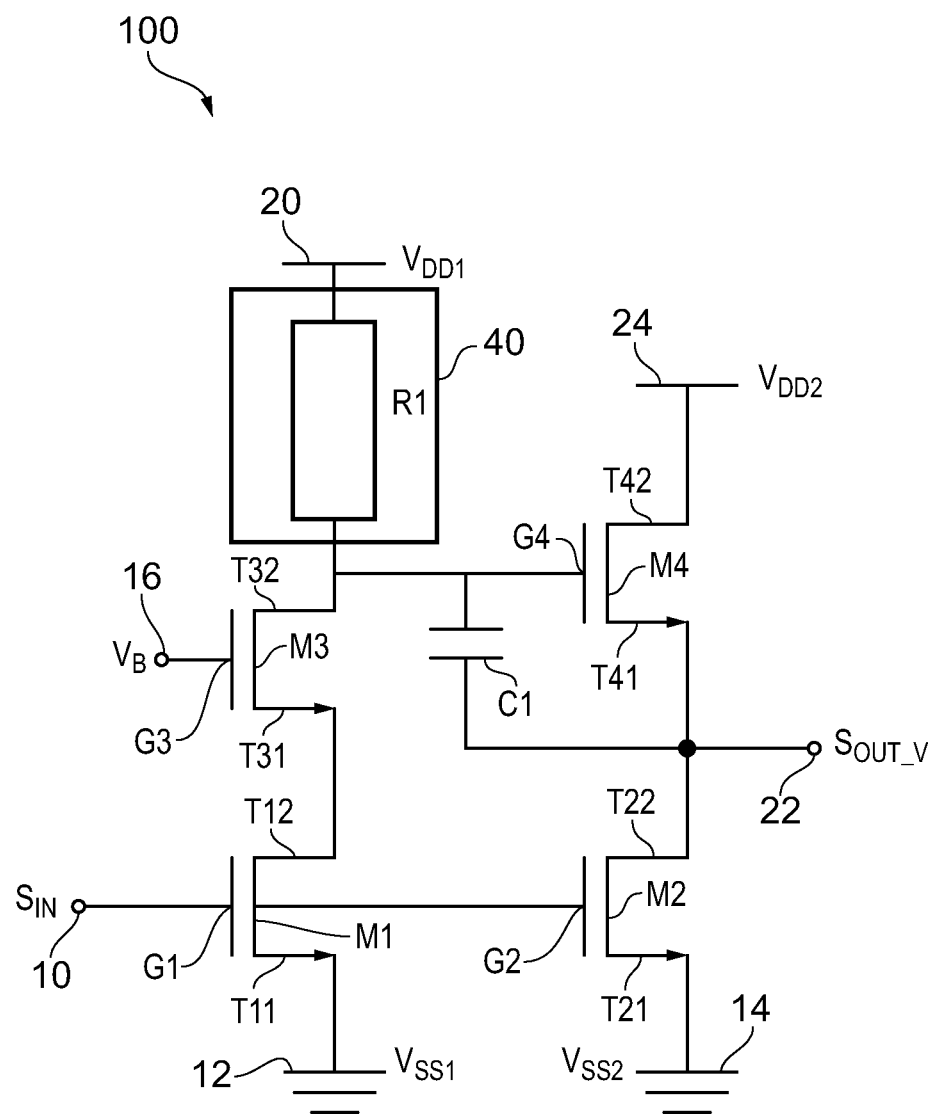
FIG. 1 is a schematic diagram of a voltage amplifier.

Referring to FIG. 1, an amplifier 100, which may also be referred to as a first amplifier 100, comprises an input 10 for an input signal $S_{IN}$, first, second third and fourth transistors M1, M2, M3, M4, and a first output 22 for a first amplified signal $S_{OUT\_V}$. A first terminal T11 the first transistor M1 is coupled to a first voltage rail 12 providing a first voltage $V_{SS1}$. A second terminal T12 the first transistor M1 coupled to a first terminal T31 of the third transistor M3. A gate G1 of the first transistor M1 is coupled to the input 10. A first terminal T21 of the second transistor M2 is coupled to a second voltage rail 14 providing a second voltage $V_{SS2}$. A second terminal T22 of the second transistor M2 is coupled to the first output 22. A gate G2 of the second transistor M2 is coupled to the input 10. A load 40 is coupled between a second terminal T32 the third transistor M3 and a third voltage rail 20 providing a third voltage $V_{DD1}$. A gate G3 of the third transistor M3 is coupled to a bias node 16 for applying a bias voltage $V_B$ to the gate G3 of the third transistor M3. A first terminal T41 of the fourth transistor M4 is coupled to the first output 22. A second terminal T42 of the fourth transistor M4 is coupled to a fourth voltage rail 24 providing a fourth voltage $V_{DD2}$. A gate G4 of the fourth transistor M4 is coupled to the second terminal T32 the third transistor M3. A first capacitive element C1 is coupled between the second terminal T32 of the third transistor M3 and the first output 22. The first and third transistors M1, M3 are, therefore, coupled in a cascode arrangement.

In the embodiment illustrated in FIG. 1, the first terminals T11, T21, T31, T41 of the respective first, second, third and fourth transistors M1, M2, M3, M4 are each a source, the second terminals T12, T22, T32, T42 of the respective first, second, third and fourth transistors M1, M2, M3, M4 are each a drain, the third voltage $V_{DD1}$ is higher than the first voltage $V_{SS1}$, and the fourth voltage $V_{DD2}$ is higher than the second voltage $V_{SS2}$. However, in other embodiments the first terminals T11, T21, T31, T41 of the respective first, second, third and fourth transistors M1, M2, M3, M4 are each a drain, the second terminals T12, T22, T32, T42 of the respective first, second, third and fourth transistors M1, M2, M3, M4 are each a source, the third voltage $V_{DD1}$ is lower than the first voltage $V_{SS1}$, and the fourth voltage $V_{DD2}$ is lower than the second voltage $V_{SS2}$. The third and fourth voltages $V_{DD1}$, $V_{DD2}$ may be equal. Likewise, the first and second voltages $V_{SS1}$, $V_{SS2}$ may be equal.

Figure 2:
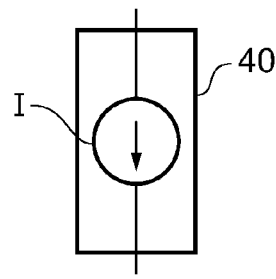
FIG. 2 is a schematic diagram of an alternative load.

In the embodiment illustrated in FIG. 1, the load 40 comprises a first resistive element R1, whereby the load 40 is resistive. In other embodiments, the load 40 may comprise an active bias circuit, such as a current source I, as illustrated in FIG. 2. Such an active bias circuit can provide high impedance and enable the third voltage $V_{DD1}$ to be lower.

Any, or all, of the first, second, third and fourth transistors M1, M2, M3, M4 may be identical, although this is not essential. For example, the second transistor M2 may be a duplicate of the first transistor M1, and the fourth transistor M4 may be a duplicate of the third transistor M3. Any of the transistors M1, M2, M3, and M4 may pair-wise consist of similar unit-cell transistors where the total transistors size is determined by the number of unit-cells associated with that device. For example, M2 could be twice the size of M1 by using twice the number of unit cells for M2 compared to M1. By using unit-cell transistors, geometry dependent process variations are minimized while still retaining some sizing flexibility. The transistors M1, M2, M3, and M4 may also consist of a small number of fringe, non-unit-cell, devices if non-integer size ratios are desired. This will degrade the process sensitivity slightly but much of the unit-cell approach benefits are retained.

In operation, the input signal $S_{IN}$ is applied at the input 10 and takes two paths from the input 10 to the first output 22. The first path is via the second transistor M2. The second path is via the first, third and fourth transistors M1, M3, M4. The first capacitive element C1 is coupled between the gate G4 of the fourth transistor M4 and the first terminal T41 of the fourth transistor M4. Consequently, relatively low frequencies in the input signal $S_{IN}$ are blocked by the first capacitive element C1, and therefore reach the first output 22 from the gate G4 of the fourth transistor M4 primarily by passing through, and being amplified by, the fourth transistor M4. However, relatively high frequencies in the input signal $S_{IN}$ reach the first output 22 from the gate G4 of the fourth transistor M4 primarily by passing through first capacitive element C1 with little, or no, amplification by M4, the first capacitive element C1 providing at least a partial short circuit across the fourth transistor M4 at relatively high frequencies.

The amplifier 100 operates as a voltage amplifier, providing voltage amplification. Therefore, first output signal $S_{OUT\_V}$ has a voltage corresponding to an amplified version of the voltage of the input signal $S_{IN}$. In other words, the first output signal $S_{OUT\_V}$ has a voltage proportional to the voltage of the input signal $S_{IN}$.

At relatively low frequencies, the bandwidth of the cascode arrangement of the first and third transistors M1, M3 is enhanced by fourth transistor M4 operating in a source follower arrangement. The fourth transistor M4 reduces the output impedance of the amplifier 100 from approximately the impedance of the load 40 to approximately the reciprocal of the transconductance $g_{m,4}$ of the fourth transistor M4, that is $1/g_{m,4}$, and moves the output pole to higher frequencies. At relatively high frequencies, the amplifier 100 behaves like a parallel arrangement of a cascode stage, formed by the first and third transistors M1, M3, and a common-source stage, formed by the second transistor M2, because the capacitance C1 becomes at least a partial short circuit, bypassing the fourth transistor M4. Moreover, due to this frequency dependence, the load 40 can have a higher impedance. Moreover, the current used to bias the fourth transistor M4 is reused by the second transistor M2, that is, flows through the second transistor M2, thereby improving efficiency and reducing noise.

The gain of the amplifier 100 at low frequencies can be approximated as $$\frac{S_{OUT-V}}{S_{IN}} \approx g_{m,1}R + \frac{g_{m,2}}{g_{m,4}} \quad (1)$$

where $g_{m,1}$ is the transconductance of the first transistor M1, $g_{m,2}$ is the transconductance of the second transistor M2, $g_{m,4}$ is the transconductance of the fourth transistor M4, and R is the impedance of the load 40.

The gain of the amplifier 100 at high frequencies can be approximated as $$\frac{S_{OUT-V}}{S_{IN}} \approx (g_{m,1} + g_{m,2})R \quad (2)$$

and therefore the gain can be boosted at high frequencies.

The output impedance $Z_{OUT}$ of the amplifier 100 is also dependent on frequency. The output impedance $Z_{OUT}$ at low frequencies can be approximated as $$Z_{OUT} \approx \frac{1}{g_{m,4}} \quad (3)$$

The output impedance $Z_{OUT}$ at high frequencies can be approximated as $$Z_{OUT} \approx R \quad (4)$$

Therefore, based on equations (1) to (4), it is possible to select the characteristics of the amplifier 100, and in particular the gain $S_{OUT\_V}/S_{IN}$ and the output impedance $Z_{OUT}$, by selecting the transconductance $g_{m,1}, g_{m,2}, g_{m,3}, g_{m,4}$ of the respective first, second third and fourth transistors M1, M2, M3, M4 and the impedance R of the load 40. Moreover, the frequency response of the amplifier 100 may be arranged to have a peak by selecting the output impedance $Z_{OUT}$ of the amplifier 100 to be inductive in conjunction with a capacitive load coupled to the first output 22.

Figure 3:
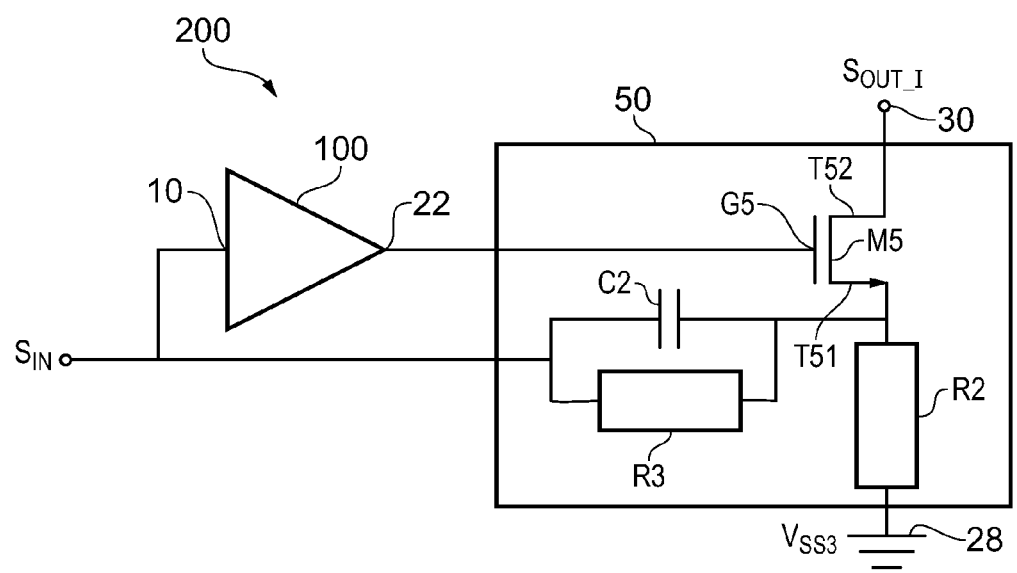
FIG. 3 is a schematic diagram of a current amplifier.

Referring to FIG. 3, an amplifier 200, which may also be referred to as a second amplifier 200, comprises the amplifier 100 described with reference to FIGS. 1 and 2, and further comprises an output stage 50 coupled to the first output 22 of the amplifier 100. The output stage 50 is also coupled to the input 10 for providing feedback to the amplifier 100. The output stage 50 presents a load capacitance between the first output 22 of the amplifier 100 and a fifth voltage rail 28. The first capacitive element C1 has a first capacitance that is arranged, in some embodiments, such that the sum of the first capacitance and an input capacitance of the fourth transistor M4 is equal to the load capacitance, or is equal within plus or minus twenty percent, or more preferably within plus or minus ten percent, of the load capacitance. This enables a peak to be introduced to the frequency response of the amplifier 200, thereby enabling a wide bandwidth to be provided by the amplifier 200. The input capacitance of the fourth transistor M4 is the capacitance between the gate G4 of the fourth transistor M4 and the first output 22.

In FIG. 3, an embodiment of the output stage 50 is illustrated, although other embodiments may be used instead. In particular, in FIG. 3, the output stage 50 comprises a second resistive element R2, a second capacitive element C2, a fifth transistor M5, and a third resistive element R3. The second resistive element R2 is coupled between a first terminal T51 of the fifth transistor M5 and the fifth voltage rail 28 providing a fifth voltage $V_{SS3}$. A second terminal T52 of the fifth transistor M5 is coupled to a second output 30 for a second output signal $S_{OUT\_I}$. A gate G5 of the fifth transistor M5 is coupled to the first output 22 of the amplifier 100. The second capacitive element C2 is coupled between the input 10 of the amplifier 100 and the first terminal T51 of the fifth transistor M5. The third resistive element R3 is coupled between the input 10 of the amplifier 100 and the first terminal T51 of the fifth transistor M5.

In the embodiment illustrated in FIG. 3, the first terminals T11, T21, T31, T41, T51 of the respective first, second, third, fourth and fifth transistors M1, M2, M3, M4, M5 are each a source, the second terminals T12, T22, T32, T42, T52 of the respective first, second, third, fourth and fifth transistors M1, M2, M3, M4, M5 are each a drain, the third voltage $V_{DD1}$ is higher than the first voltage $V_{SS1}$, and the fourth voltage $V_{DD2}$ is higher than the second voltage $V_{SS2}$. However, in other embodiments the first terminals T11, T21, T31, T41, T51 of the respective first, second, third, fourth and fifth transistors M1, M2, M3, M4, M5 are each a drain, the second terminals T12, T22, T32, T42, T52 of the respective first, second, third, fourth and fifth transistors M1, M2, M3, M4, M5 are each a source, the third voltage $V_{DD1}$ is lower than the first voltage $V_{SS1}$, and the fourth voltage $V_{DD2}$ is lower than the second voltage $V_{SS2}$. The third and fourth voltages $V_{DD1}, V_{DD2}$ may be equal. Any or all of the first voltage $V_{SS1}$, second voltage $V_{SS2}$ and fifth voltage $V_{SS3}$ may be equal. The fifth voltage $V_{SS3}$ functions as a reference ground for the amplifier 200. In embodiments where the load 40 is resistive, the gain of the amplifier 100, and therefore also of the amplifier 200, can be increased if the load 40 has a high resistance and the third voltage $V_{DD1}$ exceeds the fourth voltage $V_{DD2}$.

The amplifier 200 operates as a current amplifier, with second output signal $S_{OUT\_I}$ having a current proportional to the current of the input signal $S_{IN}$. The output impedance of the amplifier 100 described with reference to FIG. 1 can be inductive by selecting the impedance R of the load 40 to be greater than the reciprocal of the transconductance of the fourth transistor M4, that is, $R > 1/g_{m,1}$, thereby determining the frequency response of the amplifier 100 and the amplifier 200. Moreover, the capacitance of the first capacitive element C1 may be selected to provide the amplifier 100 and the amplifier 200 with a frequency response higher than first order, that is, second order or higher, thereby providing improved out-of-band selectivity. Preferably, the output stage 50 presents a load capacitance, that is, a capacitive load, between the first output 22 and the fifth voltage rail 28, and the first capacitance of the first capacitive element C1 is arranged such that the sum of the first capacitance and the input capacitance of the fourth transistor M4 is equal, within plus or minus twenty percent, or more preferably within plus or minus ten percent, to the load capacitance. The input capacitance of the fourth transistor M4 is the capacitance between the gate G4 of the fourth transistor M4 and the first output 22.

Furthermore, by making the first capacitive element C1 variable, that is, have a variable capacitance, the frequency response of the amplifier 200 may be varied, without modifying the input impedance of the amplifier 200 or the output impedance of the amplifier 200.

Figure 4:
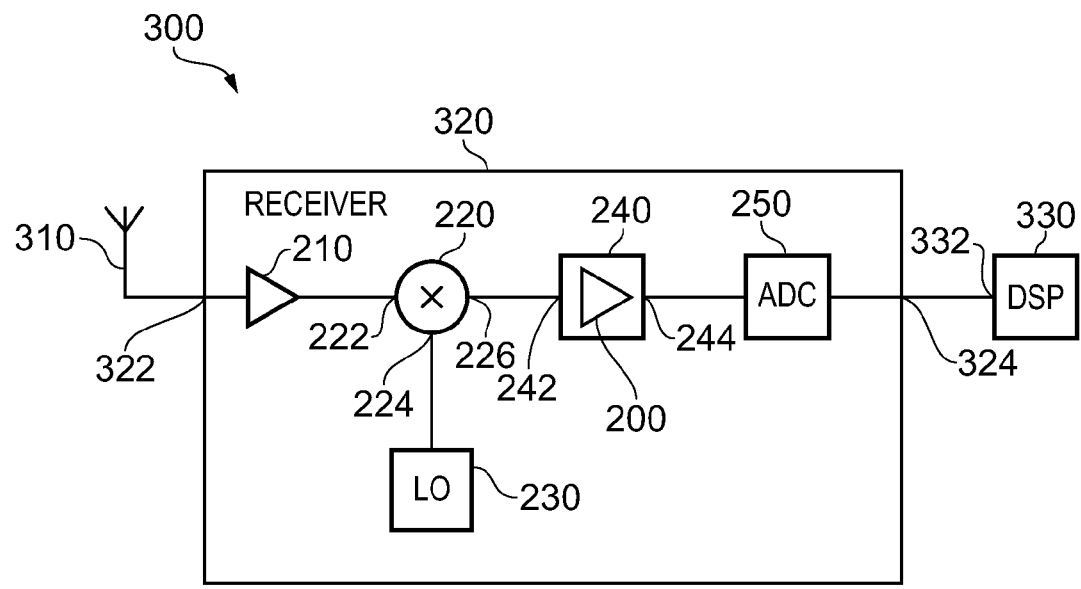
FIG. 4 is a block schematic diagram of a receiving apparatus.

Referring to FIG. 4, a receiving apparatus 300 comprises an antenna 310 coupled to an input 322 of a receiver 320. An output 324 of the receiver 320 is coupled to an input 332 of a digital signal processor (DSP) 330. The receiver 320 comprises a low noise amplifier 210 for amplifying a received signal detected by the antenna, a mixer 220, a local oscillator signal generator (LO) 230, a filter 240, and an analogue to digital converter (ADC) 250. The filter 240 comprises the amplifier 100 described with reference to FIG. 1 or the amplifier 200 described with reference to FIG. 3, and a non-illustrated load network, possibly frequency selective, such as a passive low-pass filter. The input 322 of the receiver 320 is coupled to a first input 22 of the mixer 220 by means of the low noise amplifier 210. The local oscillator signal generator (LO) 230 is coupled to a second input 224 of the mixer 220 for delivering a local oscillator signal. The mixer 220 down-converts the received signal after amplification by the low noise amplifier 210, and delivers a down-converted signal at an output 226 of the mixer 220. The output 226 of the mixer 220 is coupled to an input 242 of the filter 240 for filtering the down-converted signal, and an output 244 of the filter 240 is coupled to the output 324 of the receiver 320 by means of the ADC 250. After digitisation of the down-converted and filtered signal in the ADC 250, the digitised signal is processed by the DSP 330 to extract information conveyed by the received signal.

Figure 5:
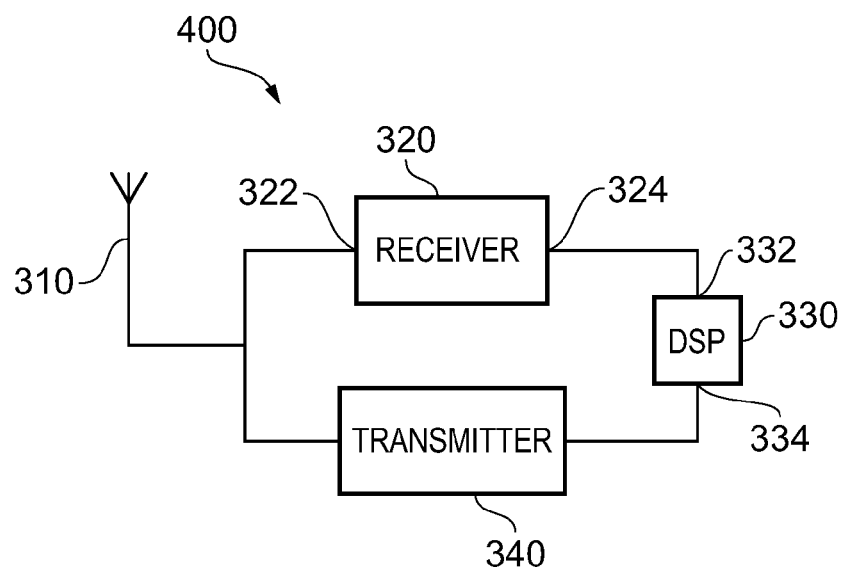
FIG. 5 is a block schematic diagram of a wireless communication device.

Referring to FIG. 5, a wireless communication apparatus 400 comprises the elements of the receiving apparatus 300 described with reference to FIG. 4, and additionally comprises a transmitter 340 coupled between an output 334 of the DSP 330 and the antenna 310 for transmitting a signal generated by the DSP 330.

Other variations and modifications will be apparent to the skilled person. Such variations and modifications may involve equivalent and other features that are already known and which may be used instead of, or in addition to, features described herein. For example, although the first, second, third, fourth and fifth transistors M1, M2, M3, M4, M5 have been described as field effect transistors (FETs), such as metal oxide semiconductor FETs (MOSFETs), alternatively bipolar junction transistors (BJTs) may be used, or a mix of transistor types.

Although wireless communication has been used as an example, the invention also has application in other fields of communication, for example optical fibre communication or communication via wire.

Features that are described in the context of separate embodiments may be provided in combination in a single embodiment. Conversely, features that are described in the context of a single embodiment may also be provided separately or in any suitable sub-combination.

It should be noted that the term "comprising" does not exclude other elements or steps, the term "a" or "an" does not exclude a plurality, a single feature may fulfil the functions of several features recited in the claims and reference signs in the claims shall not be construed as limiting the scope of the claims. It should also be noted that where a component is described as being "arranged to" or "adapted to" perform a particular function, it may be appropriate to consider the component as merely suitable "for" performing the function, depending on the context in which the component is being considered. Throughout the text, these terms are generally considered as interchangeable, unless the particular context dictates otherwise. It should also be noted that the Figures are not necessarily to scale; emphasis instead generally being placed upon illustrating the principles of the present invention.

The invention claimed is:

1. An amplifier, comprising:
   a first transistor, a second transistor, a third transistor, and a fourth transistor;
   an input for an input signal, and a first output for a first amplified signal;
   a first terminal of the first transistor coupled to a first voltage rail, a second terminal of the first transistor coupled to a first terminal of the third transistor, and a gate of the first transistor coupled to the input;
   a first terminal of the second transistor coupled to a second voltage rail, a second terminal of the second transistor coupled to the first output, and a gate of the second transistor coupled to the input;
   a load coupled between a second terminal of the third transistor and a third voltage rail, and a gate of the third transistor coupled to a bias node for applying a bias voltage to the gate of the third transistor;
   a first terminal of the fourth transistor coupled to the first output, a second terminal of the fourth transistor coupled to a fourth voltage rail, and a gate of the fourth transistor coupled to the second terminal of the third transistor; and
   a first capacitive element coupled between the second terminal of the third transistor and the first output.

2. The amplifier of claim 1, wherein the load comprises a first resistive element.

3. The amplifier of claim 1, wherein the load comprises an active bias circuit.

4. The amplifier of claim 1, wherein the second transistor is a duplicate of the first transistor.

5. The amplifier of claim 1, wherein the load has an impedance exceeding the reciprocal of a transconductance of the fourth transistor.

6. The amplifier of claim 1, wherein the first capacitive element has a first capacitance that is variable.

7. The amplifier of claim 1, comprising an output stage coupled to the first output.

8. The amplifier of claim 7:
   wherein the output stage presents a load capacitance between the first output and a fifth voltage rail; and
   wherein the first capacitive element has a first capacitance arranged such that the sum of the first capacitance and an input capacitance of the fourth transistor between the gate of the fourth transistor and the first output is equal, within plus or minus twenty percent, to the load capacitance.

9. The amplifier of claim 7:
wherein the amplifier further comprises a second output; and
wherein the output stage comprises:
  a second resistive element coupled between a first terminal of a fifth transistor and the fifth voltage rail;
  a second terminal of the fifth transistor coupled to the second output;
  a gate of the fifth transistor coupled to the first output;
  a second capacitive element coupled between the input and the first terminal of the fifth transistor; and
  a third resistive element coupled between the input and the first terminal of the fifth transistor.

10. The amplifier of claim 9, wherein the first, second, third, fourth, and fifth transistors are each one of a bipolar junction transistor (BJT) and a field effect transistor (FET).

11. The amplifier of claim 1, wherein the first, second, third, and fourth transistors are each one of a bipolar junction transistor (BJT) and a field effect transistor (FET).

12. A receiver, comprising:
an amplifier, wherein the amplifier comprises:
  a first transistor, a second transistor, a third transistor, and a fourth transistor;
  an input for an input signal, and a first output for a first amplified signal;
  a first terminal of the first transistor coupled to a first voltage rail, a second terminal of the first transistor coupled to a first terminal of the third transistor, and a gate of the first transistor coupled to the input;
  a first terminal of the second transistor coupled to a second voltage rail, a second terminal of the second transistor coupled to the first output, and a gate of the second transistor coupled to the input;
  a load coupled between a second terminal of the third transistor and a third voltage rail, and a gate of the third transistor coupled to a bias node for applying a bias voltage to the gate of the third transistor;
  a first terminal of the fourth transistor coupled to the first output, a second terminal of the fourth transistor coupled to a fourth voltage rail, and a gate of the fourth transistor coupled to the second terminal of the third transistor; and
  a first capacitive element coupled between the second terminal of the third transistor and the first output.

13. The receiver of claim 12:
wherein the amplifier has an output stage coupled to the first output;
wherein the output stage presents a load capacitance between the first output and a fifth voltage rail; and
wherein the first capacitive element has a first capacitance arranged such that the sum of the first capacitance and an input capacitance of the fourth transistor between the gate of the fourth transistor and the first output is equal, within plus or minus twenty percent, to the load capacitance.

14. The receiver of claim 12:
wherein the amplifier has an output stage coupled to the first output;
wherein the amplifier further comprises a second output; and
wherein the output stage comprises:
  a second resistive element coupled between a first terminal of a fifth transistor and the fifth voltage rail;
  a second terminal of the fifth transistor coupled to the second output;
  a gate of the fifth transistor coupled to the first output;
  a second capacitive element coupled between the input and the first terminal of the fifth transistor; and
  a third resistive element coupled between the input and the first terminal of the fifth transistor.

15. A mobile communication device, comprising:
a receiver having an amplifier, wherein the amplifier comprises:
  a first transistor, a second transistor, a third transistor, and a fourth transistor;
  an input for an input signal, and a first output for a first amplified signal;
  a first terminal of the first transistor coupled to a first voltage rail, a second terminal of the first transistor coupled to a first terminal of the third transistor, and a gate of the first transistor coupled to the input;
  a first terminal of the second transistor coupled to a second voltage rail, a second terminal of the second transistor coupled to the first output, and a gate of the second transistor coupled to the input;
  a load coupled between a second terminal of the third transistor and a third voltage rail, and a gate of the third transistor coupled to a bias node for applying a bias voltage to the gate of the third transistor;
  a first terminal of the fourth transistor coupled to the first output, a second terminal of the fourth transistor coupled to a fourth voltage rail, and a gate of the fourth transistor coupled to the second terminal of the third transistor; and
  a first capacitive element coupled between the second terminal of the third transistor and the first output.

16. The mobile communication device of claim 15:
wherein the amplifier has an output stage coupled to the first output;
wherein the output stage presents a load capacitance between the first output and a fifth voltage rail; and
wherein the first capacitive element has a first capacitance arranged such that the sum of the first capacitance and an input capacitance of the fourth transistor between the gate of the fourth transistor and the first output is equal, within plus or minus twenty percent, to the load capacitance.

17. The mobile communication device of claim 15:
wherein the amplifier has an output stage coupled to the first output;
wherein the amplifier further comprises a second output; and
wherein the output stage comprises:
  a second resistive element coupled between a first terminal of a fifth transistor and the fifth voltage rail;
  a second terminal of the fifth transistor coupled to the second output;
  a gate of the fifth transistor coupled to the first output;
  a second capacitive element coupled between the input and the first terminal of the fifth transistor; and
  a third resistive element coupled between the input and the first terminal of the fifth transistor.

* * * * *